United States Patent
Hwang

(10) Patent No.: US 8,947,956 B2
(45) Date of Patent: Feb. 3, 2015

(54) DELAY CIRCUIT AND LATENCY CONTROL CIRCUIT OF MEMORY, AND SIGNAL DELAY METHOD THEREOF

(75) Inventor: Jeong-Tae Hwang, Gyeonngi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 447 days.

(21) Appl. No.: 13/302,267

(22) Filed: Nov. 22, 2011

(65) Prior Publication Data
US 2012/0269017 A1 Oct. 25, 2012

(30) Foreign Application Priority Data
Apr. 21, 2011 (KR) .................. 10-2011-0037208

(51) Int. Cl.
*G11C 7/22* (2006.01)

(52) U.S. Cl.
CPC .................................... *G11C 7/222* (2013.01)
USPC ...................................... 365/194; 365/189.17

(58) Field of Classification Search
CPC ........................................................ G11C 7/222
USPC ................ 365/194, 189.17; 711/167; 713/401
See application file for complete search history.

(56) References Cited

U.S. PATENT DOCUMENTS

| 6,130,856 | A * | 10/2000 | McLaury ................ 365/189.16 |
| 7,835,204 | B2 * | 11/2010 | Kim et al. .................... 365/194 |
| 2002/0048197 | A1 * | 4/2002 | La ................................ 365/193 |
| 2008/0106962 | A1 * | 5/2008 | Lai ............................... 365/203 |
| 2009/0161468 | A1 * | 6/2009 | Fujioka ....................... 365/222 |
| 2011/0128794 | A1 * | 6/2011 | Yoon et al. .............. 365/189.05 |

* cited by examiner

Primary Examiner — Douglas King
(74) Attorney, Agent, or Firm — IP & T Group LLP

(57) ABSTRACT

A delay circuit includes a delay unit configured to generate a delayed transfer signal by delaying a transfer signal corresponding to a first signal or a second signal, a distinguishment signal generation unit configured to generate a distinguishment signal which represents to what signal the transfer signal correspond between the first signal and the second signal and a delayed signal generation unit configured to output the delayed transfer signal as a first delayed signal or a second delayed signal in response to the distinguishment signal.

18 Claims, 6 Drawing Sheets

US 8,947,956 B2

DELAY CIRCUIT AND LATENCY CONTROL CIRCUIT OF MEMORY, AND SIGNAL DELAY METHOD THEREOF

CROSS-REFERENCE TO RELATED APPLICATIONS

The present application claims priority of Korean Patent Application No. 10-2011-0037208, filed on Apr. 21, 2011, which is incorporated herein by reference in its entirety.

BACKGROUND

1. Field

Exemplary embodiments of the present invention relate to a delay circuit.

2. Description of the Related Art

Circuits included in an integrated circuit do not operate alone but operate along with other peripheral circuits by exchanging signals, such as data with the peripheral circuits. In general, to make an A circuit and a B circuit perform an interactive operation with each other, the A circuit requests the B circuit for a certain operation, and the A circuit waits until the B circuit performs the operation requested by the A circuit. This waiting time is referred to as latency. Latency is used to increase the transmission efficiency of signals exchanged between the A circuit and the B circuit and to allow for the internal operation time for the B circuit.

For example, an integrated circuit may include a memory controller and a memory device. When a memory controller applies a write command to the memory device, the memory device stores data inputted from the memory controller in a memory cell. The memory device, however, cannot receive the data from the memory controller as soon as it receives the write command because the memory device needs some time to internally prepare for the data storing operation. The writing preparation time is defined as write latency.

Generally, the address for storing data in a memory cell is transferred along with a write command. However, since the data is inputted into the memory device after the write latency time elapses, the address may be delayed by the write latency.

To increase the efficiency of a data bus in Double Data Rate (DDR) 2 Synchronous Dynamic Random Access Memory (SDRAM) devices and DDR3 SDRAM devices, Additive Latency (AL) may be implemented. Even though a read/write command or an address is transferred from the memory controller before a RAS to CAS Delay (tRCD), the command or address is delayed by the additive latency, and an internal read/write command or an internal address is generated after the tRCD, and a read/write operation of the semiconductor memory device is performed after the tRCD passes. The additive latency is set by EMRS (Extended Mode Register Set). The additive latency is set to a particular value in a DDR2 SDRAM device, but the additive latency is interlocked with CAS latency (CL) to 0, CL-1, and CL-2 in a DDR3 SDRAM device. The additive latency is applied to both read commands and write commands and accordingly, the address should be delayed by the additive latency.

Hereafter, a latency control circuit of a memory device that delays a read/write command and an address by an additive latency is described.

FIG. 1 is a block view of a latency control circuit of a conventional memory device.

Referring to FIG. 1, the latency control circuit of the conventional memory device includes a read command delay unit 110, a write command delay unit 120, and address delay blocks 130, 140 and 150. The first to third address delay blocks 130, 140 and 150 includes a delay control unit 130, a first unit bit delay unit 140, and a second unit bit delay unit 150. Here, it is assumed in FIG. 1 that the address is two bits.

Hereafter, the operation of the latency control circuit of the conventional memory device is described with reference to FIG. 1.

As described above, an additive latency either has a particular value or is determined by being interlocked with CAS latency. In the drawing, however, where the additive latency ranges from 0 to 4 clock periods is illustrated.

The read command delay unit 110 includes a plurality of D-flipflops 111 to 114 and a first selector 115. The D-flipflops 111 to 114 delays a signal inputted into the D-flipflops by one clock period and outputs a delayed signal in synchronization with a clock CLK. Therefore, when a read command RDCMD of 111 is inputted, the output signals OUT1A to OUT4A of the multiple D-flipflops 111 to 114 are sequentially output at an interval of one clock period.

The first selector 115 selects one signal among the read command RDCMD and the output signals OUT1A to OUT4A of the multiple D-flipflops 111 to 114 to be a delayed read command RDCMD_DEL. The first selector 115 selects one signal in response to latency information LATENCY. For example, when the additive latency is 0, the first selector 115 selects the read command RDCMD as a delayed read command RDCMD_DEL, and when the additive latency is 2, the first selector 115 selects the output signal OUT2A of the D-flipflop 112 as a delayed read command RDCMD_DEL.

In FIG. 1, the latency information is a single-bit or multi-bit digital signal whose bit number is changed according to the length of the additive latency.

The write command delay unit 120 includes a plurality of D-flipflops 121 to 124 and a second selector 125. The second selector 125 selects one signal among the signals including a write command WTCMD and the output signals OUT1B to OUT4B of the multiple D-flipflops 121 to 124 to be a delayed write command WTCMD_DEL. The second selector 125 selects one signal in response to latency information LATENCY. The structure and operation of the write command delay unit 120 is the same as the read command delay unit 110.

The delay control unit 130 of the address delay block 130, 140 and 150 includes a plurality of D-flipflops 131 to 134. The D-flipflops 131 to 134 delays a signal inputted thereto by one clock period and outputs a delayed signal in synchronization with a clock CLK. When a read command RDCMD or a write command WTCMD is applied to the memory device, an enabled command signal CMDS is inputted. Therefore, the outputs OUT1C to OUT4C of the multiple D-flipflops 131 to 134 are enabled at an interval of one clock period after the read command RDCMD or the write command WTCMD is applied.

The first unit bit delay unit 140 includes a plurality of latches 141 to 144 and a third selector 145. The first unit bit delay unit 140 delays a first bit ADD<0> of a 2-bit address that is applied to the first unit bit delay unit 140. The latches 141 to 144 respectively correspond to the D-flipflops 131 to 134. When the output of a D-flipflop corresponding thereto is enabled, the latch stores and outputs a signal OUT1D to OUT4D inputted thereto. The third selector 145 selects one among the first bit ADD<0> of the 2-bit address and the outputs OUT1D to OUT4D of the multiple latches 141 to 144 as a first bit ADD<0>_DEL of a delayed address. In this way, the first bit ADD<0> of the 2-bit address may be delayed by a command signal CMDS is delayed. In short, the first bit ADD<0> of the 2-bit address may be delayed equal to the read command RDCMD or the write command WTCMD is delayed.

The second unit bit delay unit 150 generates a second bit ADD<1>_DEL of the delayed address by delaying a second bit ADD<1> of the received 2-bit address ADD<0:1>. The structure and operation of the second unit bit delay unit 150 are the same as those of the first unit bit delay unit 140.

FIG. 2 is a block view of a D-flipflop and a latch shown in FIG. 1.

The D-flipflop generates an output signal O by synchronizing an input signal I with a clock C, or when the input signal I is synchronized with the clock C, the D-flipflop generates the output signal O by delaying the input signal I by one clock period. When a reset signal RST is enabled, the output signal O is initialized. Since the reset signal RST is used only when the D-flipflop is initialized, an end to which the reset signal RST is applied is not illustrated in the D-flipflop block diagram shown in FIG. 1, and it is not illustrated in any subsequent figures either. More specifically, the input signal I passes through a first pass gate 201 at a falling edge of the clock C to be stored in a first storage 202. The value stored in the first storage 202 passes through a second pass gate 203 at a rising edge of the clock C to be stored in a second storage 204. The stored values are transferred as the output signals O.

The latch stores the input signal I and outputs it as the output signal O when a pass signal S is enabled. More specifically, the input signal I passes through an inverter 205 and is stored in a storage 206 when the pass signal S is enabled. The input signal I transferred as the output signal O.

Here, the number of logic gates included in the D-flipflop is much more than the number of logic gates included in the latch. Therefore, the D-flipflop has a wider circuit area than the latch. Also, a D-flipflop may consume more current than a latch. However, while the D-flipflop may delay the input signal I by one clock period, the latch may delay the input signal I by one clock period only when it uses the output signal O of the D-flipflop as the pass signal S.

A latency control circuit of a conventional memory device includes the read command delay unit 110, the write command delay unit 120, and the delay control unit 130 and each of the read command delay unit 110, the write command delay unit 120, and the delay control unit 130 include a plurality of D-flipflops. Therefore, the area and current consumption of the latency control circuit of the memory device are great. A delay circuit for delaying two different signals includes two delay units that respectively delay the signals, and each of the delay units includes a plurality of D-flipflops. Therefore, the same drawback as the latency control circuit of the conventional memory device appears.

SUMMARY

An embodiment of the present invention is directed to a delay circuit that has reduced area and current consumption by sharing a delay unit to delay different signals.

In accordance with an embodiment of the present invention, a delay circuit includes: a delay unit configured to generate a delayed transfer signal by delaying a transfer signal corresponding to a first signal or a second signal; a distinguishment signal generation unit configured to generate a distinguishment signal that represents whether the transfer signal corresponds to the first signal or the second signal; and a delayed signal generation unit configured to output the delayed transfer signal as a first delayed signal or a second delayed signal in response to the distinguishment signal.

In accordance with another embodiment of the present invention, a latency control circuit of a memory device includes: a command signal delay unit configured to generate a delayed command signal by delaying a command signal corresponding to a read command or a write command by a latency; a distinguishment signal generation unit configured to generate a distinguishment signal that represents whether the command signal corresponds to the read command or the write command; and a delayed command generation unit configured to output the delayed command signal as a delayed read command or a delayed write command in response to the distinguishment signal.

In accordance with yet another embodiment of the present invention, a latency control circuit of a memory device may include: a command delay unit configured to generate a delayed command by delaying an inputted command between a read command and a write command by a latency; and a command distinguishment unit configured to distinguish which command is inputted to the command delay unit between the read command and a write command.

In accordance with still another embodiment of the present invention, a method for delaying a signal includes: generating a transfer signal corresponding to a signal when a first signal or a second signal is applied; generating a distinguishment signal that represents to what signal the transfer signal correspond between the first signal and the second signal; generating a delayed transfer signal by delaying the transfer signal; and outputting the delayed transfer signal as a first delayed signal or a second delayed signal in response to the distinguishment signal.

DETAILED DESCRIPTION

Figure 1:
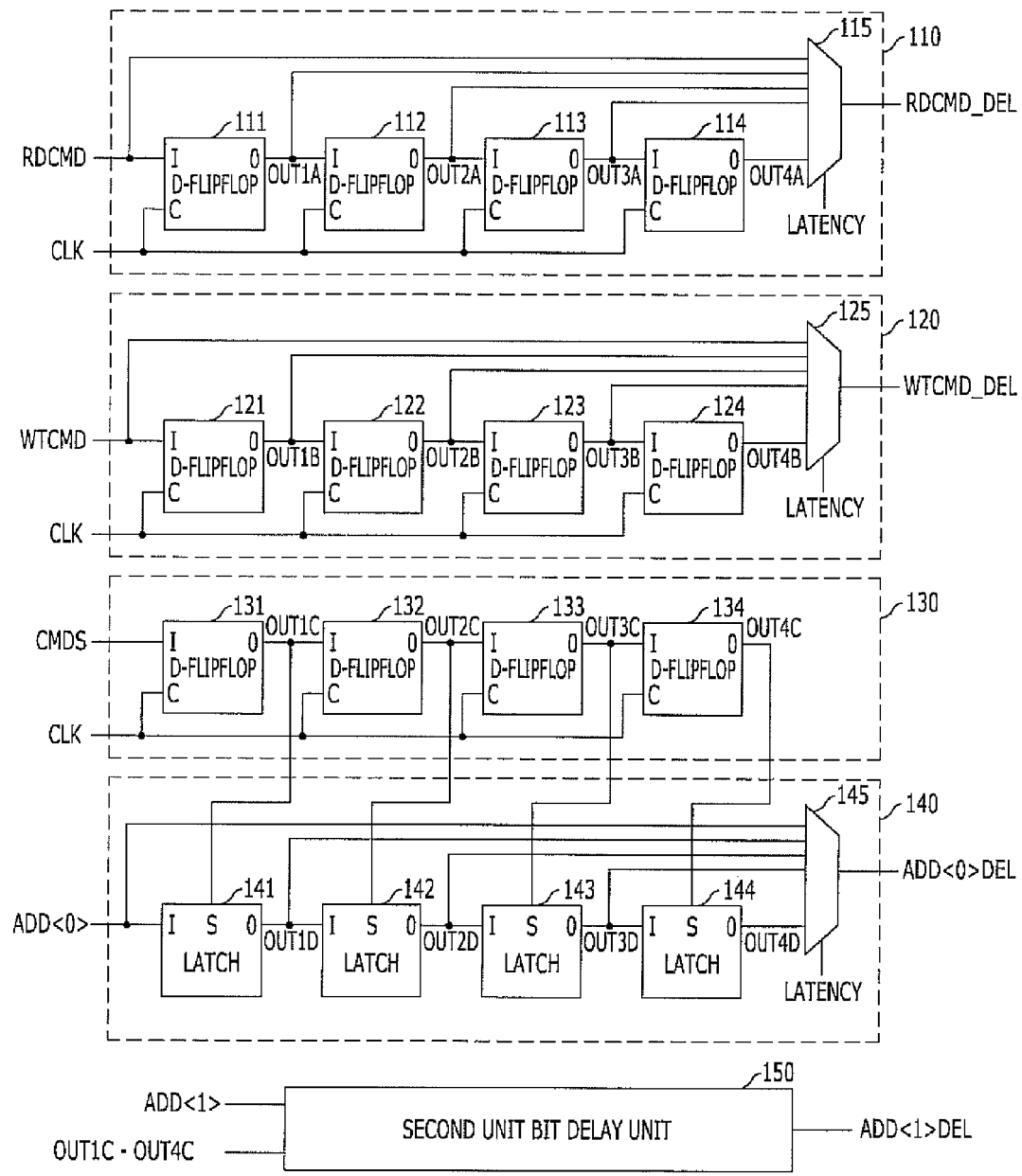
FIG. 1 is a block view of a latency control circuit of a conventional memory device.
Figure 2:
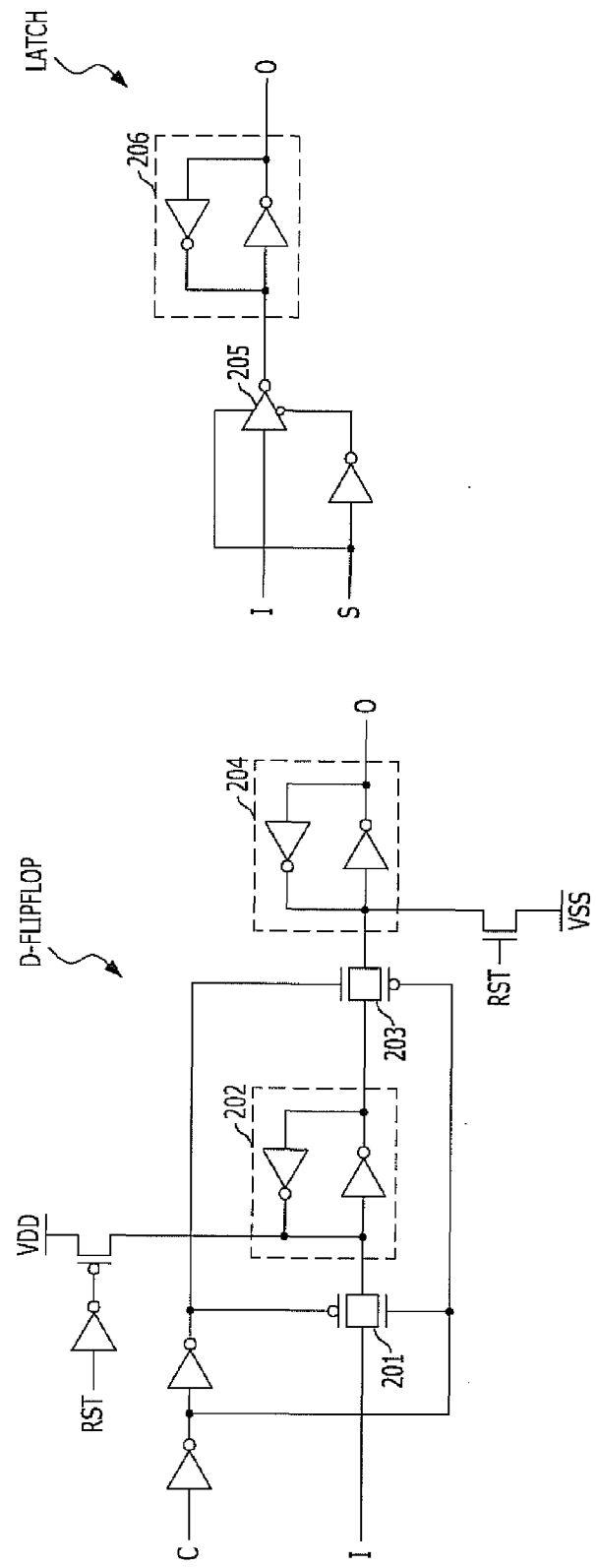
FIG. 2 illustrates the structure of a D-flipflop and a latch shown in FIG. 1.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
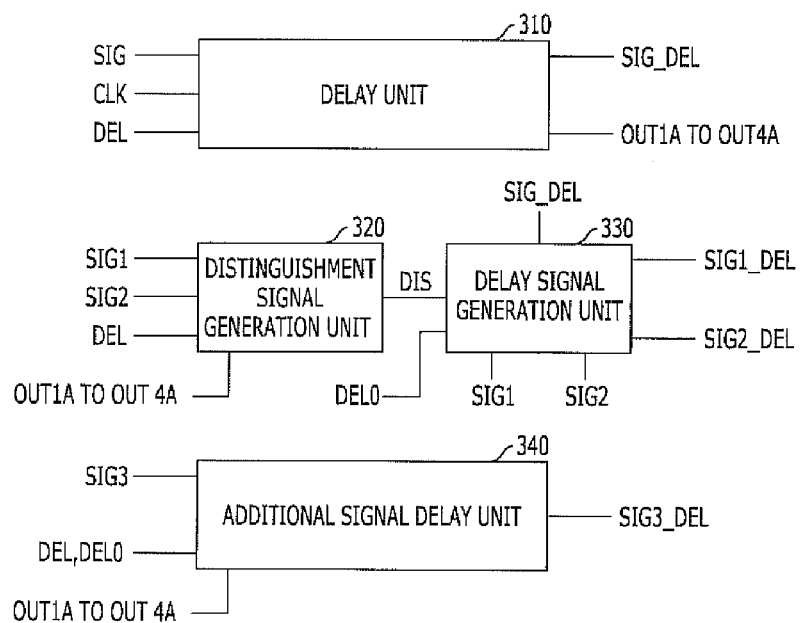
FIG. 3 is a block view of a delay circuit in accordance with an embodiment of the present invention.

FIG. 3 is a block view of a delay circuit in accordance with an embodiment of the present invention.

Referring to FIG. 3, the delay circuit includes a delay unit 310, a distinguishment signal generation unit 320, and a delay signal generation unit 330. The delay unit 310 generates a delayed transfer signal SIG_DEL by delaying a transfer signal SIG corresponding to a first signal SIG1 or a second signal SIG2. The distinguishment signal generation unit 320 generates a distinguishment signal DIS that indicates which signal the transfer signal SIG corresponds to between the first signal SIG1 and the second signal SIG2. The delay signal generation unit 330 outputs the delayed transfer signal SIG_DEL as a first delayed signal SIG1_DEL or a second delayed signal SIG2_DEL in response to the distinguishment signal DIS. Also, the delay circuit further includes an additional signal delay unit 340 for generating a third delayed signal SIG3_DEL by delaying a third signal SIG3. The third delayed signal is delayed by the delay amount that the transfer signal SIG is delayed to become the delayed transfer signal SIG_DEL.

Hereafter, the operation of the delay circuit is described with reference to FIG. 3.

The delay circuit of FIG. 3 generates the first delayed signal SIG1_DEL by delaying the first signal SIG1, the second delayed signal SIG2_DEL by delaying the second signal SIG2, and the third delayed signal SIG3_DEL by delaying the third signal SIG3 by the delay amount that the first signal SIG1 or the second signal SIG2 is delayed. For example, the delay value may range from 0 to 4 clock periods. A delay value is the number of clock periods that the first delayed signal SIG1_DEL, the second delayed signal SIG2_DEL, and the third delayed signal SIG3_DEL are delayed from the input signals, which are the first signal SIG1, the second signal SIG2, and the third signal SIG3. More specifically, the delay value means the number of clock periods that the delayed transfer signal SIG_DEL is delayed compared to the transfer signal SIG, the number of clock periods that the first delayed signal SIG1_DEL is delayed compared to the first signal SIG1, the number of clock periods that the second delayed signal SIG2_DEL is delayed compared to the second signal SIG2, and the number of clock periods that the third delayed signal SIG3_DEL is delayed compared to the third signal SIG3.

The delay unit 310 generates the delayed transfer signal SIG_DEL by delaying the transfer signal SIG in synchronization with a clock CLK. The transfer signal SIG is enabled when the first signal SIG1 or the second signal SIG2 is applied. When the delay value for delaying the transfer signal SIG is more than 0 clock periods, the delay value is determined based on delay information DEL. The delay information DEL may be a single-bit or multi-bit digital signal, and the number of bits of the delay information DEL depends on the range of the delay value. In FIG. 3, an exemplary embodiment where the delay value of the delayed transfer signal SIG_DEL ranges from 0 clock to 4 clock periods is described.

When the delay value of the first delayed signal SIG1_DEL or the second delayed signal SIG2_DEL is 0 clock periods, the delayed transfer signal SIG_DEL is not used, and neither the first delayed signal SIG1_DEL nor the second delayed signal SIG2_DEL is generated. Thus, the delay unit does not have to generate the delayed transfer signal SIG_DEL when the delay value is 0 clock periods. Outputs OUT1A to OUT4A are output signals of a plurality of unit delayers 410 to 440 included in the delay unit 310. The unit delayers 410 to 440 will be described later with reference to FIG. 4.

The distinguishment signal generation unit 320 generates a distinguishment signal DIS that indicates which signal the transfer signal SIG corresponds to between the first signal SIG1 and the second signal SIG2. The transfer signal SIG corresponding to the first signal SIG1 means that the transfer signal SIG is enabled in response to the applied first signal SIG1, and the transfer signal SIG corresponding to the second signal SIG2 means that the transfer signal SIG is enabled in response to the applied second signal SIG2.

The distinguishment signal DIS may have a first value when the transfer signal SIG is enabled in response to the applied first signal SIG1, and the distinguishment signal DIS may have a second value when the transfer signal SIG is enabled in response to the applied second signal SIG2. The first value and the second value of the distinguishment signal DIS are different from each other. The distinguishment signal DIS is delayed by the delay value of the delayed transfer signal SIG_DEL unless the delay value is 0 clock periods, and the distinguishment signal DIS is transferred to the delay signal generation unit 330.

The delay signal generation unit 330 outputs the delayed transfer signal SIG_DEL as the first delayed signal SIG1_DEL or the second delayed signal SIG2_DEL in response to the distinguishment signal DIS. When the distinguishment signal DIS has the first value, which may be where the transfer signal SIG corresponds to the first signal SIG1, the delay signal generation unit 330 outputs the delayed transfer signal SIG_DEL as the first delayed signal SIG1_DEL, and when the distinguishment signal DIS has the second value, which may be where the transfer signal SIG corresponds to the second signal SIG2, the delay signal generation unit 330 outputs the delayed transfer signal SIG_DEL as the second delayed signal SIG2_DEL. The transfer signal SIG is enabled when the first signal SIG1 or the second signal SIG2 is applied, and the delayed transfer signal SIG_DEL is outputted as the first delayed signal SIG1_DEL or the second delayed signal SIG2_DEL. Thus, the delay value of the first delayed signal SIG1_DEL or the second delayed signal SIG2_DEL is the same as the delay value of the delayed transfer signal SIG_DEL.

When the delay value of the first delayed signal SIG1_DEL and the second delayed signal SIG2_DEL is 0 clock periods, a non-delay signal DEL0 is enabled, and the first signal SIG1 is outputted as the first delayed signal SIG1_DEL or the second signal SIG2 is outputted as the second delayed signal SIG2_DEL. More specifically, when the delay value is 0 clock periods, the first delayed signal SIG1_DEL or the second delayed signal SIG2_DEL is generated not based on the delayed transfer signal SIG_DEL but based on the first signal SIG1 or the second signal SIG2. The non-delay signal DEL0 is a signal indicating whether the delay value is 0 clock periods or not. When the delay value is 0 clock periods, the non-delay signal DEL0 is enabled. When the delay value is not 0 clock periods, the non-delay signal DEL0 is disabled.

The additional signal delay unit 340 generates the third delayed signal SIG3_DEL by delaying the third signal SIG3 by the delay value of the first delayed signal SIG1_DEL or the second delayed signal SIG2_DEL. The third signal SIG3 is applied along with the first signal SIG1 or the second signal SIG2. The additional signal delay unit 340 delays the third signal SIG3 based on the delay information DEL and the non-delay signal DEL0 in order to make the delay value of the third delayed signal SIG3_DEL the same as the delay value of the first delayed signal SIG1_DEL or the delay value of the second delayed signal SIG2_DEL.

Hereafter, the operation of the delay circuit shown in FIG. 3 is described by the following example for illustration purposes.

When the first signal SIG1 is applied, the transfer signal SIG is enabled, and the delay unit 310 delays the transfer signal SIG a delay value based on the delay information DEL to generate the delayed transfer signal SIG_DEL.

The distinguishment signal generation unit 320 generates the distinguishment signal DIS having the same delay value as the delayed transfer signal SIG_DEL. In the current example, since the transfer signal SIG corresponds to the first signal SIG1, the distinguishment signal DIS has the first value.

The delay signal generation unit 330 outputs the delayed transfer signal SIG_DEL as the first delayed signal SIG1_DEL in response to the distinguishment signal DIS, which has the first value. The delayed transfer signal SIG_DEL and the distinguishment signal DIS have the same delay value, and the two signals are transferred to the delay signal generation unit 330. Also, the additional signal delay unit 340 generates the third delayed signal SIG3_DEL by delaying the third signal SIG3 by the delay value of the first delayed signal SIG1_DEL.

When the second signal SIG2 is applied, the same operation is performed as where the first signal SIG1 is applied, except that the distinguishment signal DIS becomes the second value, and the delay signal generation unit 330 outputs the delayed transfer signal SIG_DEL as the second delayed signal SIG2_DEL.

The delay circuit according to the embodiment of the present invention does not have as many delay units as signals to be delayed. For example, the delay circuit does not have one delay unit for delaying the first signal SIG1 and another, separate delay unit for delaying the second signal SIG2. The delay circuit includes one delay unit for the two signals by distinguishing whether the signal to be delayed signal is the first signal SIG1 or the second signal SIG2 based on the distinguishment signal DIS. By including fewer delay units, the delay circuit may reduce its circuit area and power consumption. The distinguishment signal DIS indicates whether the transfer signal SIG delayed in the delay unit 310 is the first signal SIG1 or the second signal SIG2. If the transfer signal SIG corresponds to the first signal SIG1, the delay signal generation unit 330 generates the first delayed signal SG1_DEL. If the transfer signal SIG corresponds to the second signal SIG2, the delay signal generation unit 330 generates the second delayed signal SIG2_DEL. The transfer signal SIG is delayed with one delay unit 310, regardless of whether the delayed signal is the first signal SIG1 or the second signal SIG2.

Figure 4:
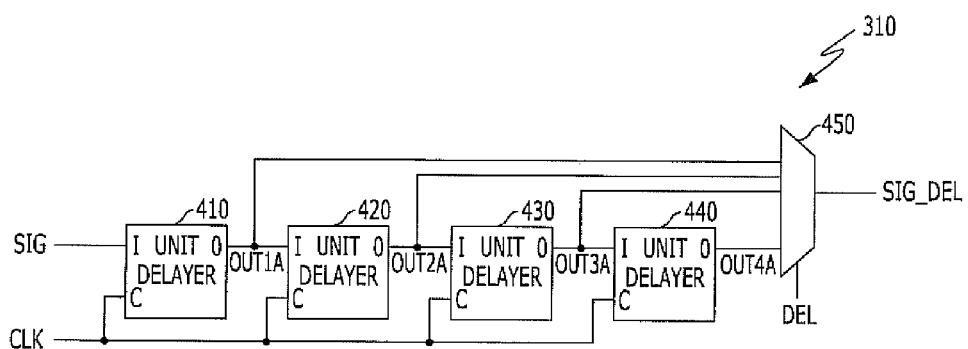
FIG. 4 is a block view of a delay unit 310 shown in FIG. 3.

FIG. 4 is a block view of the delay unit 310 shown in FIG. 3.

Referring to FIG. 4, the delay unit 310 includes a plurality of unit delayers 410 to 440 and a first selector 450. Each of the unit delayers 410 to 440 delays an input signal by the unit delayer's unit delay value, and each unit delayer outputs a delayed signal. The first selector 450 selects one of the outputs OUT1A to OUT4A of the unit delayers 410 to 450 as the delayed transfer signal SIG_DEL in response to the delay information DEL. The unit delayers 410 to 440 are coupled in series, and the input to the first unit delayer 410 is the transfer signal SIG.

Hereafter, the operation of the delay unit 310 is described with reference to FIG. 4.

Each of the unit delayers 410 to 440 delays an input signal by the unit delayer's unit delay value, for example, one clock period, and outputs a delayed signal in synchronization with a clock CLK. Each of the unit delayers 410 to 440 may include a D-flipflop. The input of the first unit delay 410 is the transfer signal SIG, and the outputs OUT1A to OUT4A of the unit delayers 410 to 440 are sequentially enabled at an interval of one clock period when the transfer signal SIG is inputted. The first selector 450 selects one among the outputs OUT1A to OUT4A of the unit delayers 410 to 440 as the delayed transfer signal SIG_DEL based on the delay information DEL.

For example, when the delay value based on the delay information DEL is two clock periods, the first selector 450 selects the output OUT2A of the second unit delayer 420 as the delayed transfer signal SIG_DEL. When the delay value based on the delay information DEL is four clock periods, the first selector 450 selects the output OUT4A of the fourth unit delayer 440 as the delayed transfer signal SIG_DEL.

The delay unit 310 delays the transfer signal SIG, and the distinguishment signal generation unit 320 generates the distinguishment signal DIS, and the additional signal delay unit delays the third signal SIG3. The function of the distinguishment signal generation unit 320 will be described hereafter with reference to FIG. 5.

Figure 5:
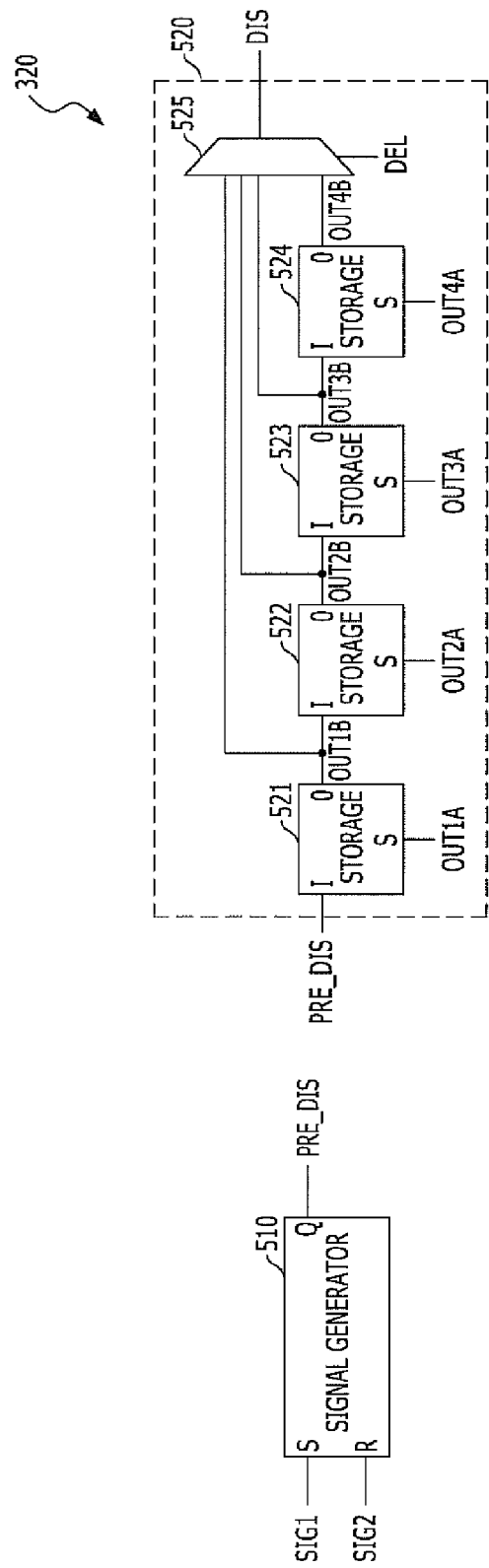
FIG. 5 is a block view of a distinguishment signal generation unit 320 shown in FIG. 3.

FIG. 5 is a block view of a distinguishment signal generation unit 320 shown in FIG. 3.

Referring to FIG. 5, the distinguishment signal generation unit 320 includes a signal generator 510 and a signal delayer 520. The signal generator 510 generates a preliminary distinguishment signal PRE_DIS in response to the first signal SIG1 or the second signal SIG2. The signal delayer 520 generates the distinguishment signal DIS by delaying the preliminary distinguishment signal PRE_DIS equal to the amount that the transfer signal SIG is delayed to become the delayed transfer signal SIG_DEL.

The signal delayer 520 includes a plurality of first storages 521 to 524 and a second selector 525. The second selector 525 selects the output of one of the first storages 521 to 524 as the distinguishment signal DIS in response to delay information DEL. The multiple first storages 521 to 524 correspond to the unit delayers 410 to 440, respectively. When the output of a unit delayer among the unit delayers 410 to 440 is enabled, the first storage corresponding to the unit delayer stores a signal input from the corresponding unit storage and outputs an output signal OUT1B to OUT4B. The first storages 521 to 524 are serially coupled with each other, and the signal inputted to the first storage 521 is the preliminary distinguishment signal PRE_DIS.

Hereafter, the operation of the distinguishment signal generation unit 320 is described with reference to FIG. 5.

The signal generator 510 makes the value of the preliminary distinguishment signal PRE_DIS a first value in response to the first signal SIG1, and makes the value of the preliminary distinguishment signal PRE_DIS a second value in response to the second signal SIG2. The signal generator 510 may include an RS latch, and the first signal SIG1 may be applied to a set input S of the RS latch, and the second signal SIG2 may be applied to a reset input R of the RS latch. The preliminary distinguishment signal PRE_DIS may be an output Q of the RS latch. In the embodiment using an RS latch, the logic level of the first value may be high and the logic level of the second value may be low. Hereafter, an example where the first value is in a high logic level and the second value is in a low logic level is described.

The first storages 521 to 524 respectively correspond to the unit delayers 410 to 440. When the output of a unit delayer is enabled, the first storage corresponding to the unit delayer among the multiple first storages 521 to 524 stores the signal inputted to its input end I and outputs the inputted signal to its output end O. The outputs OUT1A to OUT4A of the unit delayer corresponding to the first storages 521 to 524 are inputted to a pass end S of the first storage among the multiple storages 521 to 534. In the embodiment shown in FIG. 5, the multiple first storages 521 to 524 may be latches.

For example, the output OUT2A of the unit delayer 420 is inputted to the pass end S of the first storage 522, and when the output OUT2A of the unit delayer 420 is enabled, the first storage 522 stores a signal inputted to its input end I and outputs the input signal to the storage output end O. As another example, the output OUT4A of the unit delayer 440 is inputted to the pass end S of the first storage 524, and when the output OUT4A of the unit delayer 440 is enabled, the first storage 524 stores a signal inputted to its input end I and outputs the input signal to the storage output end O.

More specifically, when one output among the outputs OUT1A to OUT4A of the multiple unit delayers 410 to 440 is enabled, the outputs OUT1B to OUT4B of the multiple first storages 521 to 524 corresponding to the unit delayer with the enabled output is enabled as well. Therefore, the outputs OUT1B to OUT4B of the multiple first storages 521 to 524 have the same delay value as the outputs OUT1A to OUT4A of the multiple unit delayers 410 to 440.

The second selector 525 selects one output among the outputs OUT1B to OUT4B of the multiple first storages 521 to 524 as the distinguishment signal DIS based on the delay information DEL. The distinguishment signal DIS is a signal obtained by delaying the preliminary distinguishment signal PRE_DIS based on the delay information DEL. Therefore, the distinguishment signal DIS has the same delay value as the delayed transfer signal SIG_DEL, and the distinguishment signal DIS is applied to the delayed signal generation unit 330 with the delayed transfer signal SIG_DEL. When the delay value is 0 clock periods, the first signal SIG1 is outputted as the first delayed signal SIG1_DEL, and the second signal SIG2 is outputted as the second delayed signal SIG2_DEL. Thus, the distinguishment signal DIS does not have to be generated when the delay value is 0 clock periods.

Figure 6:
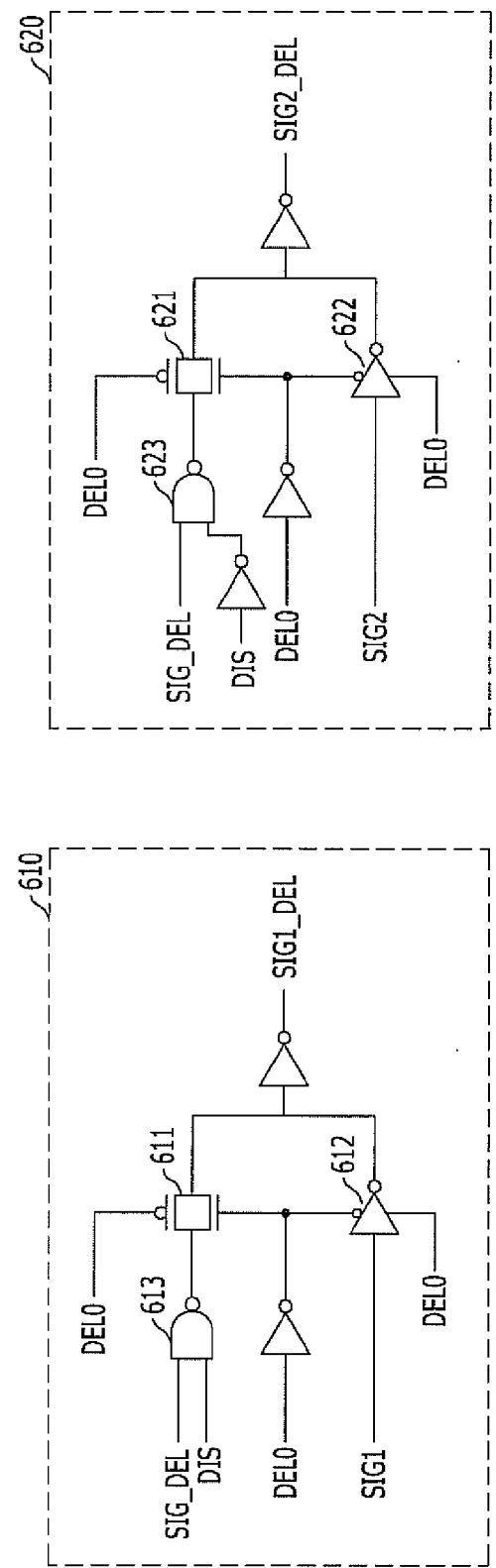
FIG. 6 is a block view of a delay signal generation unit 330 shown in FIG. 3.

FIG. 6 is a block view of the delayed signal generation unit 330 shown in FIG. 3.

Referring to FIG. 6, the delayed signal generation unit 330 includes a first delayed signal generator 610 and a second delayed signal generator 620. The first delayed signal generator 610 transfers the delayed transfer signal SIG_DEL as the first delayed signal SIG1_DEL when the transfer signal SIG corresponds to the first signal SIG1. As shown in FIG. 6, when a non-delayed signal DEL0 is enabled, the first delayed signal generator 610 outputs the first signal SIG1 as the first delayed signal SIG1_DEL. The second delayed signal generator 620 transfers the delayed transfer signal SIG_DEL as the second delayed signal SIG2_DEL when the transfer signal SIG corresponds to the second signal SIG2. As shown in FIG. 6, when a non-delayed signal DEL0 is enabled, the second delayed signal generator 620 outputs the second signal SIG2 as the second delayed signal SIG2_DEL.

Hereafter, the operation of the delayed signal generation unit 330 is described with reference to FIG. 6.

The first delayed signal generator 610 includes a first pass gate 611, a first inverter 612, and a first NAND gate 613. When the transfer signal SIG corresponds to the first signal SIG1, the distinguishment signal DIS is in a logic high level, and the non-delay signal DEL0 is disabled, the delayed transfer signal SIG_DEL is transferred as the first delayed signal SIG1_DEL through the first NAND gate 613 and the first pass gate 611. When the transfer signal SIG corresponds to the first signal SIG1, and the non-delay signal DEL0 is enabled, the first signal SIG1 is transferred as the first delayed signal SIG1_DEL.

The second delayed signal generator 620 includes a second pass gate 621, a second inverter 622, and a second NAND gate 623. When the transfer signal SIG corresponds to the second signal SIG2, the distinguishment signal DIS is in a logic low level, and the non-delay signal DEL0 is disabled, the delayed transfer signal SIG_DEL is transferred as the second delayed signal SIG2_DEL through the second NAND gate 623 and the second pass gate 621. When the transfer signal SIG corresponds to the second signal SIG2 and the non-delay signal DEL0 is enabled, the second signal SIG2 is transferred as the second delayed signal SIG2_DEL.

The delayed signal generation unit 330 generates the first delayed signal SIG1_DEL or the second delayed signal SIG2_DEL based on the delayed transfer signal SIG_DEL when the delay value is not 0 clock periods. When the delay value is 0 clock periods, the delayed signal generation unit 330 outputs the first signal SIG1 as the first delayed signal SIG1_DEL or the second signal SIG2 as the second delayed signal SIG2_DEL.

The delayed signal generation unit 330 does not always have to output the first signal SIG1 as the first delayed signal SIG1_DEL and the second signal SIG2 as the second delayed signal SIG2_DEL when the delay value is 0 clock periods. For example, the transfer signal SIG and the non-delay signal DEL0 may be inputted to the first selector 450. When the non-delay signal DEL0 is enabled in the first selector 450 of the delay unit 310 and the first selector 450 selects the transfer signal SIG as the delayed transfer signal SIG_DEL, the delayed signal generation unit 330 may generate the first delayed signal SIG1_DEL or the second delayed signal SIG2_DEL based on the delayed transfer signal SIG_DEL, and the delay value of the transfer signal SIG_DEL would be 0 clock periods. In this embodiment, the preliminary distinguishment signal PRE_DIS and the non-delay signal DEL0 may be inputted to the second selector 525. When the second selector 525 of the distinguishment signal generation unit 320 selects the preliminary distinguishment signal PRE_DIS as the distinguishment signal DIS, the delayed transfer signal SIG_DEL and the distinguishment signal DIS are input to the delayed signal generation unit 330 with the delay value of 0 clock periods. In this embodiment, the the delayed signal generation unit 330 does not include a structure to output the first signal SIG1 or the second signal SIG2 as the first delayed signal SIG1_DEL or the second delayed signal SIG2_DEL.

Figure 7:
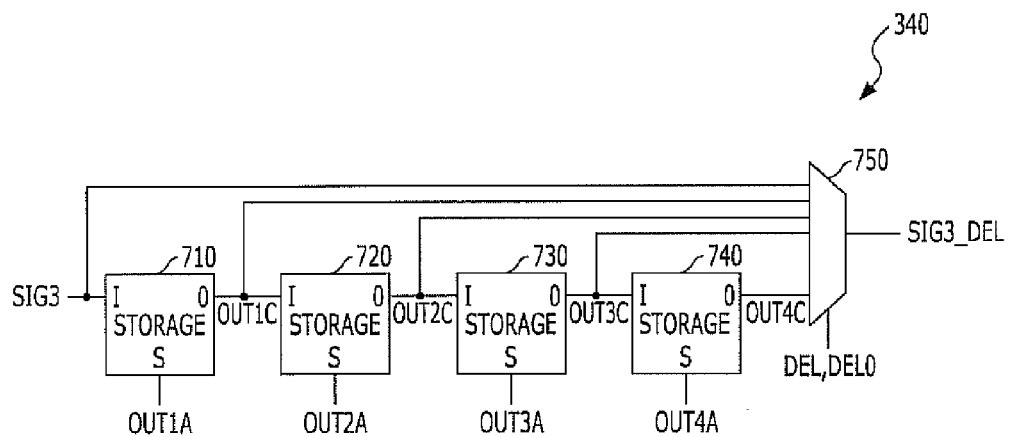
FIG. 7 is a block view of an additional signal delay unit 340 shown in FIG. 3.

FIG. 7 is a block view of the additional signal delay unit 340 shown in FIG. 3.

Referring to FIG. 7, the additional signal delay unit 340 includes a plurality of second storages 710 to 740 and a third selector 750. The third selector 750 selects the output of one of the second storages 710 to 740 as the third delayed signal in response to the non-delay signal DEL0 and the delay information DEL. The multiple second storages 710 to 740 correspond to the unit delayers 410 to 440, respectively. When the output of a unit delayer among the unit delayers 410 to 440 is enabled, the second storage corresponding to the unit delayer stores a signal input from the corresponding second storage and outputs an output signal OUT1C to 4C. The second storages 710 to 740 are serially coupled with each other, and the signal inputted to the second storage 710 is the third signal SIG3.

Hereafter, the operation of the additional signal delay unit 340 is described with reference to FIG. 7.

The second storages 710 to 740 respectively correspond to the unit delayers 410 to 440. Also, when the output of a unit delayer is enabled, the second storage corresponding to the unit delayer among the multiple second storages 710 to 740 stores the signal inputted to its input end I and outputs the inputted signal to the second storage output end O. The outputs OUT1A to OUT4A of the unit delayer corresponding to the first storages 710 to 740 is inputted to a pass end S of the second storage among the second storages 710 to 740. In the embodiment shown in FIG. 5, the multiple second storages 710 to 740 may be latches.

For example, the output OUT2A of a unit delayer 420 is inputted to the pass end S of the second storage 720, and when the output OUT2A of the unit delayer 420 is enabled, the second storage 720 stores a signal inputted to the second storage input end I and outputs the input signal to the second storage output end O. As another example, the output OUT4A of a unit delayer 440 is inputted to the pass end S of the second storage 740, and when the output OUT4A of the unit delayer 440 is enabled, the second storage 740 stores a signal inputted to the second storage input end I and outputs the input signal to the second storage output end O.

More specifically, when one output among the outputs OUT1A to OUT4A of the multiple unit delayers 410 to 440 is enabled, the outputs OUT1C to OUT4C corresponding to the unit delayer with the enabled output is enabled as well. Therefore, the outputs OUT1C to OUT4C of the multiple second storages 710 to 740 have the same delay value as the outputs OUT1A to OUT4A of the multiple unit delayers 410 to 440.

The third selector 750 selects one output among the third signal SIG3 and the outputs OUT1C to OUT4C of the multiple second storages 710 to 740 as the third delayed signal SIG3_DEL based on the non-delay signal DEL0 and the delay information DEL. In particular, when the delay value is 0 clock periods (when the non-delay signal DEL0 is enabled), the third signal SIG3 is transferred as the third delayed signal SIG3_DEL.

The third signal SIG3 is applied with the first signal SIG1 and the second signal SIG2. The delay value of the third delayed signal SIG3_DEL is the same as the delay value of the first delayed signal SIG1_DEL or the second delayed signal SIG2_DEL.

As described above with reference to FIGS. 3 to 7, the unit delayers 410 to 440 may be D-flipflops, and the multiple first storages 521 to 524 and the multiple second storages 710 to 740 may be latches.

The delay circuit according to an embodiment of the present invention may delay the first signal SIG1 and the second signal SIG2 with one delay unit 310 by using the distinguishment signal DIS, which distinguishes the first signal SIG1 and the second signal SIG2 from each other. In the delay circuit according to an embodiment of the present invention, the area and current consumption of the delay circuit are decreased compared to those of a conventional delay circuit.

Referring back to FIGS. 3 to 7, a latency control circuit of a memory device in accordance with the embodiment of the present invention is described.

Referring to FIG. 3, the latency control circuit of a memory device includes a command signal delay unit 310, a distinguishment signal generation unit 320, and a delayed command generation unit 330. The command signal delay unit 310 generates the delayed transfer signal SIG_DEL by delaying a command signal SIG by a latency. The command signal SIG corresponds to a read command SIG1 or a write command SIG2. The distinguishment signal generation unit 320 generates a distinguishment signal DIS that represents which command the command signal SIG corresponds between the read command SIG1 and the write command SIG2. The delayed command generation unit 330 outputs a delayed command signal SIG_DEL as a delayed read command SIG1_DEL or a delayed write command SIG2_DEL in response to the distinguishment signal DIS. Also, the latency control circuit further includes an address delay unit 340 that generates a delayed address signal SIG3_DEL by delaying an address signal SIG3 applied along with the read command SIG1 or the write command SIG2 by a latency.

The latency means the delay value mentioned with reference to FIGS. 3 to 7. The latency control circuit of a memory device illustrated in FIG. 3 shows an embodiment where the address SIG3 is of one bit. When the number of bits in the address signal SIG3 increases, another address delay circuit is added that has the same structure and operation as the additional signal delay unit 340. An additional signal delay unit is added for every additional bit more than one bit of the address signal SIG3. Also, the latency may be an additive latency.

The delayed command generation unit 330 outputs the delayed command signal SIG_DEL as the delayed read command SIG1_DEL when the command signal SIG corresponds to the read command SIG1, and outputs the delayed command signal SIG_DEL as the delayed write command SIG2_DEL when the command signal SIG corresponds to the write command SIG2. When the latency is 0, the delayed command generation unit 330 outputs the read command SIG1 as the delayed read command SIG1_DEL or outputs the write command SIG2 as the delayed write command SIG2_DEL.

The distinguishment signal DIS is delayed from the read command SIG1 or the write command SIG2 by the latency. In the latency control circuit according to the embodiment of the present invention, the read command SIG1 corresponds to the first signal SIG1, and the write command SIG2 corresponds to the second signal SIG2. The command signal SIG corresponds to the transfer signal SIG, and the address SIG3 corresponds to the third signal SIG3. Also, the delayed read command SIG1_DEL corresponds to the first delayed signal SIG1_DEL, and the delayed write command SIG2_DEL corresponds to the second delayed signal SIG2_DEL, and the delayed address SIG3_DEL corresponds to the third delayed signal SIG3_DEL. The delayed command signal SIG_DEL corresponds to the delayed transfer signal SIG_DEL.

The latency control circuit of a memory device has the same structure and operation as the delay circuit described with reference to FIGS. 3 to 7.

Referring back to FIGS. 3 to 7, a latency control circuit of a memory device in accordance with another embodiment of the present invention is described.

Referring to FIG. 3, the latency control circuit includes a command delay unit 310 and a command distinguishment unit 320 and 330. The command delay unit 310 generates a delayed command by delaying either a read command SIG1 or a write command SIG2. The command distinguishment unit 320 distinguishes whether the command inputted to the command delay unit 310 is the read command SIG1 or the write command SIG2. The latency control circuit further includes an address delay unit 340 for generating a delayed address SIG3_DEL by delaying an address signal SIG3, which is inputted along with a read command SIG1 or a write command SIG2, by a latency.

The distinguishment signal generation unit 320 and the delayed signal generation unit 330 shown in FIG. 3 correspond to a structure that distinguishes whether the command delayed in the delay unit 310 is a read command SIG1 or a write command SIG2.

In other words, the applied command is delayed in the command delay unit 310. Whether the delayed command is a read command SIG1 or a write command SIG2 is distinguished in the command distinguishment unit 320. Since the operation of the memory device in response to the read command SIG1 and the operation of the memory device in response to the write command SIG2 are different, the structure for delaying the read command SIG1 and the structure for delaying the write command SIG2 may be designed separately.

According to an embodiment of the present invention, the command distinguishment unit 320 distinguishes the type of command to be delayed by the command delay unit 310. Therefore both the read command SIG1 and the write command SIG2 can be delayed by the command delay unit 310.

When the distinguishment result of the command distinguishment unit 320 indicates that the command inputted to the command delay unit 310 is a read command SIG1, the delayed command SIG_DEL generated in the command delay unit 310 is a delayed read command SIG1_DEL. On the other hand, when the distinguishment result of the command distinguishment unit 320 indicates that the command inputted to the command delay unit 310 is a write command SIG2, the delayed command SIG_DEL generated in the command delay unit 310 is a delayed write command SIG2_DEL. Both the delayed read command SIG1_DEL and the delayed write command SIG2_DEL are delayed by the latency FIG. 8 is a flowchart describing a method for delaying a signal in accordance with an embodiment of the present invention.

Figure 8:
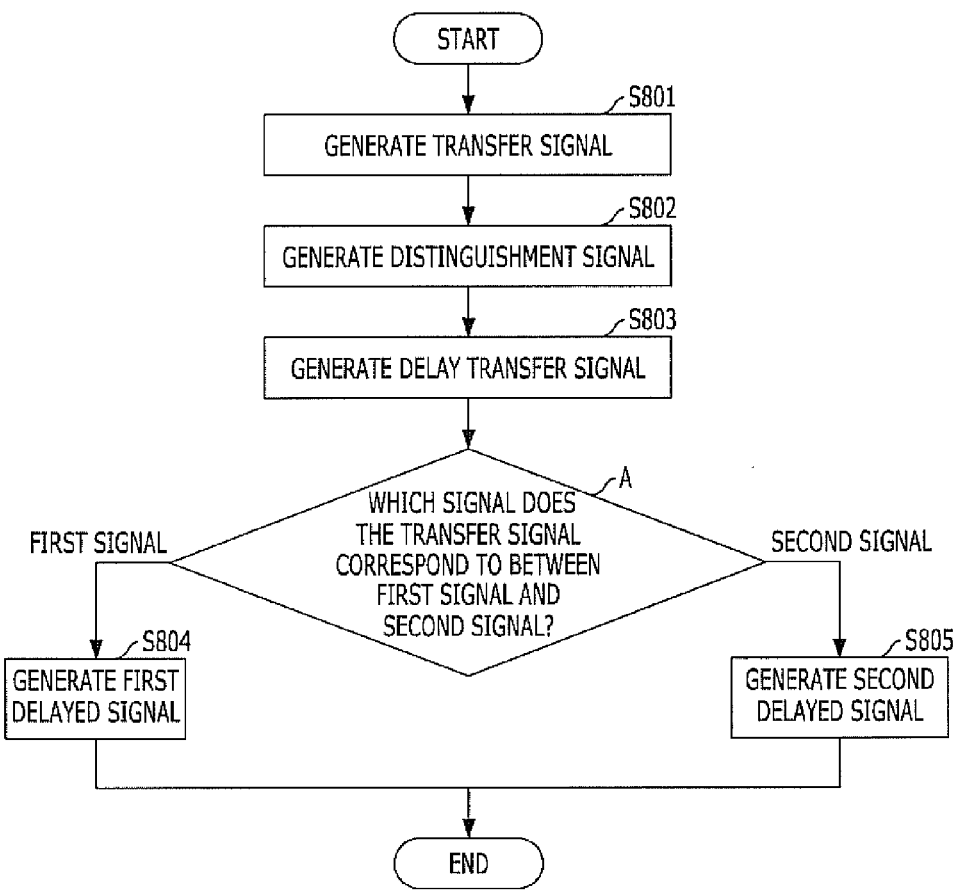
FIG. 8 is a flowchart describing a method for delaying a signal in accordance with an embodiment of the present invention.

Referring to FIG. 8, the signal delaying method includes generating a transfer signal SIG corresponding to an applied signal when a first signal SIG1 or a second signal SIG2 is applied in step S801; generating a distinguishment signal DIS that represents which signal the transfer signal SIG corresponds between the first signal SIG1 and the second signal SIG2 in step S802; generating a delayed transfer signal SIG_DEL by delaying the transfer signal SIG in step S803; and outputting the delayed transfer signal SIG_DEL as a first delayed signal SIG1_DEL or a second delayed signal SIG2_DEL in response to the distinguishment signal DIS.

Hereafter, the method for delaying a signal in accordance with the embodiment of the present invention is described with reference to FIGS. 3 to 8.

When the delay operation for a signal begins and the first signal SIG1 or the second signal SIG2 is applied, the transfer signal SIG corresponding to the applied signal is generated in step S801, which is referred to as a transfer signal generation step S801. In step S802, the distinguishment signal DIS is generated, which is referred to as a distinguishment signal generation step S802, hereafter. The distinguishment signal DIS represents which signal the transfer signals SIG corresponds to between the first signal SIG1 and the second signal SIG2. Subsequently, a delayed transfer command SIG_DEL is generated in step S803 by delaying the generated transfer signal SIG, which is referred to as a delayed transfer command generation step S803.

In the method for delaying a signal in accordance with the embodiment of the present invention, the delayed transfer command generation step S803 has to be performed after the transfer signal generation step S801. However, the distinguishment signal generation step S802 does not have to be performed before or after the transfer signal generation step S801 and the distinguishment signal generation step S802 does not have to be performed before or after the delayed transfer command generation step S803. The distinguishment signal generation step S802 may be performed while the transfer signal generation step S801 or the delayed transfer command generation step S803 are performed.

When the transfer signal SIG corresponds to the first signal SIG1, the delayed transfer signal SIG_DEL moves to step S804 from A and outputs the first delayed signal SIG1_DEL in step S804, which is referred to as a first delayed signal generation step S804. On the other hand, when the transfer signal SIG corresponds to the second signal SIG2, the delayed transfer signal SIG_DEL moves to step S805 from A and outputs the second delayed signal SIG2_DEL in step S805, which is referred to as a second delayed signal generation step S805.

When the delay value is 0 clock, the logic flow does not have to pass through all of the steps shown in FIG. 8. The transfer signal generation step S801, the distinguishment signal generation step S802, and the delayed transfer command generation step S803 may be skipped, and the first delayed signal generation step S804 or the second delayed signal generation step S805 may be performed immediately without performing steps S801-S803. Steps S801-S803 are not performed because the delay circuit may output the first signal SIG1 as the first delayed signal SIG1_DEL and may output the second signal SIG2 as the second delayed signal SIG2_DEL. to the delay circuit may also generate the transfer signal SIG and then output the transfer signal SIG as the delayed command SIG_DEL and subsequently generate the first delayed signal SIG1_DEL or the second delayed signal SIG2_DEL based on the distinguishment signal DIS and the delayed command SIG_DEL.

The features of the signal delaying method according to the embodiment of the present invention are the same as the features of the delay circuit described with reference to FIGS. 3 to 7.

The present invention reduces the area and current consumption of a circuit including a delay unit by distinguishing the types of signals to be delayed by the delay unit by implementing a distinguishment signal and using one delay unit to delay multiple, different signals.

While the present invention has been described with respect to the specific embodiments, it will be apparent to those skilled in the art that various changes and modifications may be made without departing from the spirit and scope of the invention as defined in the following claims.

What is claimed is:

1. A delay circuit, comprising:
    a delay unit configured to generate a delayed transfer signal by delaying a transfer signal wherein the transfer signal is enabled when a first signal or a second signal is applied;
    a distinguishment signal generation unit configured to generate a distinguishment signal which has a first value when the transfer signal is enabled in response to the applied first signal, and has a second value when the transfer signal is enabled in response to the applied second signal; and
    a delayed signal generation unit configured to output the delayed transfer signal as a first delayed signal when the distinguishment signal has the first value, or output the delayed transfer signal as a second delayed signal when the distinguishment signal has the second value.

2. The delay circuit of claim 1, wherein when a non-delay signal is enabled, the delayed signal generation unit outputs the first signal as the first delayed signal, or outputs the second signal as the second delayed signal.

3. The delay circuit of claim 2, wherein the delayed signal generation unit comprises:
    a first delayed signal generator for outputting the delayed transfer signal as the first delayed signal when the distinguishment signal has the first value, while outputting the first signal as the first delayed signal when the non-delay signal is enabled; and
    a second delayed signal generator for outputting the delayed transfer signal as the second delayed signal when distinguishment signal has the second value, while outputting the second signal as the second delayed signal when the non-delay signal is enabled.

4. The delay circuit of claim 1, wherein the first delayed signal is a signal obtained by delaying the first signal by a delay amount that the transfer signal is delayed, and the second delayed signal is a signal obtained by delaying the second signal by a delay amount that the transfer signal is delayed.

5. The delay circuit of claim 1, wherein the delay unit comprises:
   a plurality of unit delayers each of which delays an input signal based on a unit delay value and outputs the input signal; and
   a first selector for selecting an output of one unit delayer among the plurality unit delayers as the delayed transfer signal in response to delay information,
   wherein the plurality of unit delayers are serially coupled, and an input of the first unit delayer among the plurality of unit delayers is the transfer signal.

6. The delay circuit of claim 5, wherein the distinguishment signal generation unit comprises:
   a signal generator for generating a preliminary distinguishment signal in response to the first signal or the second signal; and
   a signal delayer for generating the distinguishment signal by delaying the preliminary distinguishment signal by a delay amount that the transfer signal is delayed.

7. The delay circuit of claim 6, wherein the signal delayer comprises:
   a plurality of first storages; and
   a second selector for selecting an output of one first storage among the plurality of first storages as the distinguishment signal in response to the delay information,
   wherein the plurality of first storages correspond to the plurality of unit delayers, respectively, and when an output of a unit delayer is enabled among the plurality of unit delayers, a first storage corresponding to the unit delayer stores and outputs an input signal inputted thereto, and
   the plurality of first storages are serially coupled, and a signal inputted to the first storage among the plurality of first storages is the preliminary distinguishment signal.

8. The delay circuit of claim 5, further comprising:
   an additional signal generation unit for generating a third delayed signal by delaying a third signal applied along with the first signal or the second signal by a delay amount that the transfer signal is delayed.

9. The delay circuit of claim 8, wherein the additional signal generation unit outputs the third signal as the third delayed signal when the non-delay signal is enabled.

10. The delay circuit of claim 9, wherein the additional signal generation unit comprises:
    a plurality of second storages; and
    a third selector for selecting an output of one second storage among the plurality of second storages as the third delayed signal in response to the non-delay signal and the delay information,
    wherein the plurality of second storages correspond to the plurality of unit delayers, respectively, and when an output of a unit delayer is enabled among the plurality of unit delayers, a second storage corresponding to the unit delayer stores and outputs an input signal inputted thereto, and
    the plurality of second storages are serially coupled, and a signal inputted to the first second storage among the plurality of first storages is the third signal.

11. The delay circuit of claim 10, wherein the plurality of unit delayers are D-fiipflops, and the plurality of first storages and the plurality of second storages are latches.

12. A latency control circuit of a memory device, comprising:
    a command signal delay unit configured to generate a delayed command signal by delaying a command signal, wherein the command signal is enabled when a read command or a write command is applied, by a latency;
    a distinguishment signal generation unit configured to generate a distinguishment signal which has a first value when the command signal is enabled in response to the applied read command, and has a second value when the command signal is enabled in response to the applied write command; and
    a delayed command generation unit configured to output the delayed command signal as a delayed read command when the distinguishment signal has the first value, or output the delayed command signal a delayed write command when the distinguishment signal has the second value.

13. The latency control circuit of claim 12, wherein the delayed command generation unit outputs the read command as the delayed read command or outputs the write command as the delayed write command, when the latency is 0.

14. The latency control circuit of claim 12, wherein the distinguishment signal is a signal delayed from the read command or the write command by the latency.

15. The latency control circuit of claim 12, further comprising:
    an address delay unit configured to generate a delayed address by delaying an address applied along with the read command or the write command by the latency.

16. The latency control circuit of claim 12, wherein the latency is an additive latency.

17. A method for delaying a signal, comprising:
    generating a transfer signal which is enabled when a first signal or a second signal is applied;
    generating a distinguishment signal which has a first value when the transfer signal is enabled in response to the applied first signal, and has a second value when the transfer signal is enabled in response to the applied second signal;
    generating a delayed transfer signal by delaying the transfer signal; and
    outputting the delayed transfer signal as a first delayed signal when the distinguishment signal has the first value, and output the delayed transfer signal as a second delayed signal when the distinguishment signal has the second value.

18. The method of claim 17, wherein if a latency is zero, outputting the first signal or the second signal as the first delayed signal or the second delayed signal.

* * * * *